(12) United States Patent
Yang et al.

(10) Patent No.: US 7,776,700 B2
(45) Date of Patent: Aug. 17, 2010

(54) LDMOS DEVICE AND METHOD

(75) Inventors: Hongning Yang, Chandler, AZ (US); Veronique C. Macary, Chandler, AZ (US); Jiang-Kai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 807 days.

(21) Appl. No.: 11/650,188

(22) Filed: Jan. 4, 2007

(65) Prior Publication Data

US 2008/0166849 A1  Jul. 10, 2008

(51) Int. Cl.
    H01L 21/336 (2006.01)
(52) U.S. Cl. .......................... 438/286; 257/408; 257/549
(58) Field of Classification Search .................. 438/286, 438/525
    See application file for complete search history.

(56) References Cited

U.S. PATENT DOCUMENTS

| 5,716,866 | A | 2/1998 | Dow et al. | |
|---|---|---|---|---|
| 6,599,804 | B2 * | 7/2003 | Bulucea et al. | 438/301 |
| 7,279,767 | B2 * | 10/2007 | Wu et al. | 257/487 |
| 7,393,752 | B2 | 7/2008 | Yang et al. | |
| 2006/0006461 | A1 * | 1/2006 | Chidambaram | 257/341 |

OTHER PUBLICATIONS

Ma, Jun, et al., Graded-Channel MOSFET (GCMOSFET) for High Performance, Low Voltage DSP Applications, IEEE Transaction on Very Large Scale Integration (VSLI) System, vol. 5, No. 4 Dec. 1997.
Buti, Taqi, et al, A New Asymmetrical Halo Source GOLD Drain (HS-GOLD) Deep Sub-Half-Micrometer n-MOSFET Deign for Reliability and Performance, IEEE Transactions on Electron Devices, vol. 38, No. 8, Aug. 1991.
Deshpande, Hemant V., et al., Analog Device Design for Low Power Mixed Mode Applications in Deep Submicron CMOS Technology, IEEE Electron Device Letters, vol. 22, No. 12, Dec. 2001.
Odanaka, Shinji and Hiroki, Akira, Potential Design and Transport Property of 0.1-um MOSFET with Asymmetric Channel Profile, IEEE Transactions on Electron Devices, vol. 44, No. 4, Apr. 1997.

* cited by examiner

*Primary Examiner*—N Drew Richards
*Assistant Examiner*—Swapneel Chhaya
(74) *Attorney, Agent, or Firm*—Ingrassia, Fisher & Lorenz, P.C.

(57) ABSTRACT

An N-channel device (40, 60) is described having a very lightly doped substrate (42) in which spaced-apart P (46) and N (44) wells are provided, whose lateral edges (461, 45) extending to the surface (47). The gate (56) overlies the surface (47) between the P (46) and N (44) wells. The P-well edge (461) adjacent the source (50) is substantially aligned with the left gate edge (561). The N-well edge (45) lies at or within the right gate edge (562), which is spaced a first distance (471) from the drain (48). The N-well (44) desirably includes a heavier doped region (62) in ohmic contact with the drain (48) and with its left edge (621) located about half way between the right gate edge (562) and the drain (48). A HALO implant pocket (52) is provided underlying the left gate edge (561) using the gate (56) as a mask. The resulting device (40, 60) operates at higher voltage with lower Rdson, less HCI and very low off-state leakage. P and N dopants are interchanged to provide P-channel devices.

20 Claims, 5 Drawing Sheets

LDMOS DEVICE AND METHOD

FIELD OF THE INVENTION

The present invention generally relates to semiconductor devices and methods for fabricating semiconductor devices, and more particularly relates to laterally diffused metal-oxide-semiconductor devices (LDMOS) and methods therefore.

BACKGROUND OF THE INVENTION

Processing technologies and device structures for forming integrated circuits (ICs) are implemented by using a plurality of interconnected field effect transistors (FETs), also called metal oxide semiconductor field effect transistors (MOSFETs), or simply MOS transistors or devices. A well known sub-set of MOS transistors are referred to as laterally diffused metal oxide semiconductor (LDMOS) transistors or devices. Although the term "MOS device" properly refers to a device having a metal gate electrode and an oxide gate insulator, that term will be used throughout to refer to any semiconductor device that includes a conductive gate electrode (whether metal or not) that is positioned over a gate insulator (whether oxide or other insulator) which, in turn, is positioned over a semiconductor substrate. Accordingly, the terms metal-oxide-semiconductor and the abbreviation "MOS" are used herein even though such devices may not employ just metals or oxides but combinations of conductive materials, e.g., alloys, silicides, doped semiconductors, etc., instead of metals, and insulating materials other than oxides (e.g., nitrides, oxy-nitride mixtures, etc.). Thus, as used hereon the terms MOS and LDMOS are intended to include such variations.

A typical MOS transistor includes a gate electrode as a control electrode and spaced-apart source and drain electrodes between which a current can flow. A control voltage applied to the gate electrode controls the flow of current through a channel between the source and drain electrodes. In an LDMOS device, a drift space is provided between the channel region and the drain region. For convenience of description and not intended to be limiting, n-channel LDMOS devices are illustrated herein, but persons of skill in the art will understand that the present invention is not limited merely to n-channel devices and that p-channel and other types of devices may be provided by substitution of semiconductor regions of opposite conductivity type.

FIG. 1 is a simplified schematic cross-sectional view through LDMOS device 20 according to the prior art. Device 20 is formed in a semiconductor and comprises N-type buried layer (NBL) 21 and P-type substrate 22, in which have been formed N-type drift space or region 24 and P-well 26 having PN-junction 25 therebetween, extending to surface 27. N+ drain 28 is formed in N-drift space 24 and N+ source 30 is formed in P-well 26. P-type buried layer (PBL) 23 may also be included. Dielectric 34, e.g., silicon oxide, is formed on surface 27. Gate 36 is provided on dielectric 34 extending laterally approximately from source 30 to and overlapping N-drift space 24. N-type diffused region 32 may also be provided extending from source 30 under the edge of gate 36 to insure that a high resistance region does not exist between source 30 and channel 35 in P-well 26. Dielectric side-wall spacers 37 and 38 are provided covering lateral edges 361-362 of gate 36 and extending over portion 271 of surface 27 above N-drift region 24 to drain 28. Portion 271 also corresponds to the gate-drain separation distance. Portion 381 of spacer 38 between gate edge 362 and drain region 28 is often referred to as a "silicide blocker" since its function is, among other things, to prevent a silicide layer (not shown) often used for making ohmic contacts to source-drain regions 30, 28 from shorting out portion 271 of surface 27.

5 to 10 volt LDMOS devices are widely used in wireless applications. 7.5 volt (and higher voltage) LDMOS devices are expected to be among the next generation of high frequency (>4 MHZ) power switches to replace the current generation 5 volt MOSFET devices that have potential reliability issues due to transient drain voltage overshoot at high frequencies. Shrinking LDMOS device sizes is a key requirement to obtain both high performance and lower cost. However, major design and process problems prevent current-day LDMOS devices from being further shrunk below about 0.5 µm process technology. Breaking through the 0.5 µm barrier in 0.13 µm technology and below faces serious challenges, for example, misalignment errors, hot carrier injection (HCI) and leakage issues. Accordingly, there is an ongoing need to provide improved LDMOS devices structures and manufacturing processes that mitigate or avoid these and other problems encountered with current generation devices.

Accordingly, it is desirable to provide a new type of deep submicron semiconductor device, and more particularly, deep submicron LDMOS devices and methods able to operate at voltages above 5 volts. In addition, it is desirable to provide a structure and method for fabricating deep submicron LDMOS devices of improved performance under the current minimum channel length of 0.5 µm. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1:
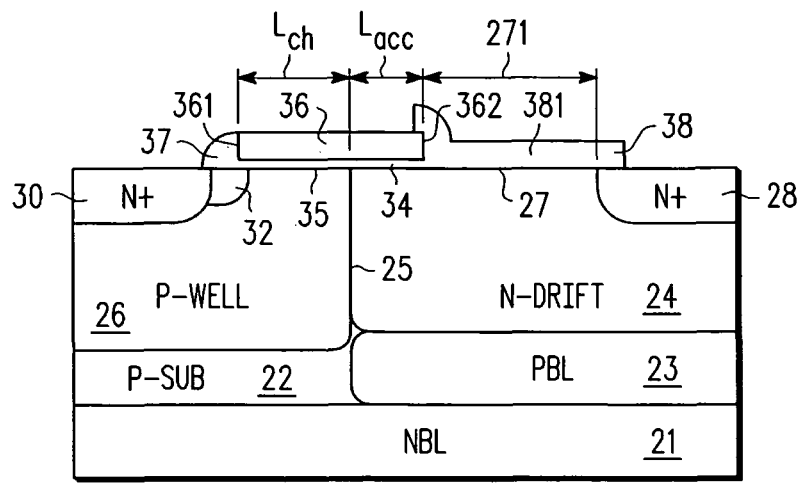
FIG. 1 is a simplified schematic cross-sectional view through an LDMOS device according to the prior art.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus.

The terms "left," right," "in," "out," "front," "back," "up," "down, "top," "bottom," "over," "under," "above," "below" and the like in the description and the claims, if any, are used for descriptive purposes and not necessarily for describing permanent relative positions. It is to be understood that the terms so used are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner.

Referring again to FIG. 1, the channel length $L_{ch}$ and the accumulation length $L_{acc}$ are typically defined by non-self aligned ion implantations. The minimum $L_{ch}$ is generally limited to 0.5 μm due to lithographic misalignment error. The use of silicide block region 381 and thin gate oxide 34 (e.g., ≦100 Angstrom Units) in 0.13 μm technology causes enhanced hot carrier injection (HCI) degradation even for LDMOS devices that have longer $L_{ch}$. HCI problems with conventional LDMOS devices will grow worse as device dimensions are shrunk further and operating voltages are increased. An improved structure and fabrication method are needed to mitigate these problems.

Figure 2:
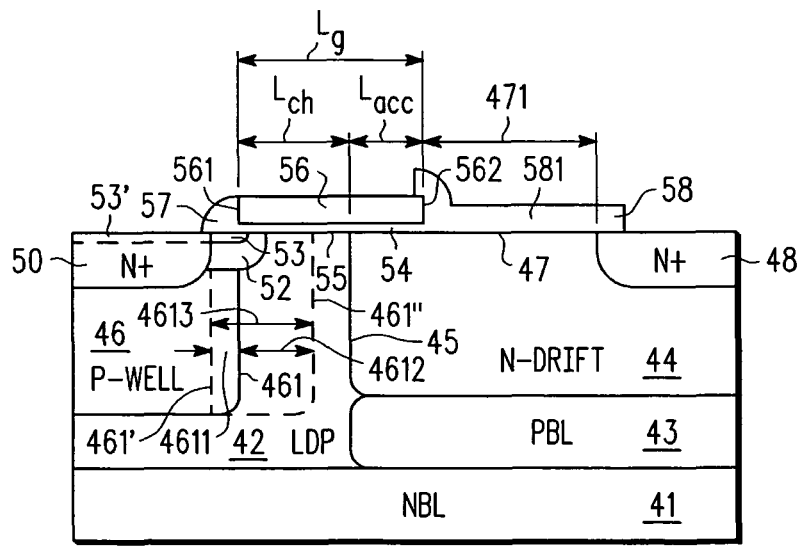
FIG. 2 is a simplified schematic cross-sectional view through an LDMOS device according to an embodiment of the invention.

FIG. 2 is a simplified schematic cross-sectional view through LDMOS device 40 according to an embodiment of the invention. For convenience of description, N-channel devices are illustrated, but this is not intended to be limiting and persons of skill in the art will understand based on the description herein that P-channel devices may also be formed by interchanging conductivity types. Device 40 comprises N-type buried layer (NBL) 41 and very lightly doped P-region (LDP) 42. P-type buried layer (PBL) 43 may be included but is not essential. N-type drift space 44 and P-well 46 are located in P-region 42. PN-junction 45 extending to surface 47 is formed between P-region 42 and N-drift space 44. N+ drain 48 is formed in N-drift space 44 and N+ source 50 is formed in or overlapping a portion of P-well 46. Dielectric 54, e.g., silicon oxide, is formed on surface 47. Gate 56 is provided on dielectric 54 extending laterally approximately from source 50 to and overlapping N-drift space 44. It is desirable that edge 461 of P-well 46 be substantially aligned (e.g., to the available lithographic alignment tolerance) with lateral gate edge 561 of gate 56. However, in various embodiments, edge 461 of P-well 46 may be displaced from exact alignment with gate edge 561, as indicated for example, by P-well edges 461' to the left of exact alignment and 461" to the right of exact alignment with gate edge 561. As used herein, the word "left" and "leftwardly" refer to directions toward the source-side of gate 56 and the word "right and "rightwardly" refer to directions toward the drain side of gate 56. The precision with which gate edge 561 and P-well edge 461 can be aligned depends generally upon the alignment tolerance of the lithographic system being used. Distance 4611 indicates the distance by which P-well edge 461' is leftwardly displaced from exact alignment with gate edge 561 and distance 4612 indicates the distance by which P-well edge 461" is rightwardly displaced from exact alignment with gate edge 561. It is desirable that distance 4611 be less than or equal about fifteen percent of the gate length Lg, more preferably less than or equal about ten percent of the gate length Lg. It is desirable that distance 4612 be usefully less than or equal about fifty percent of the gate length Lg, more conveniently less than or equal about twenty-five percent of the gate length Lg and preferably less than or equal about ten percent of the gate length Lg. Unless otherwise specifically stated, the words "substantially aligned" or the like as used herein referring to the relative position of P-well edge 461 and gate edge 561 are intended to include the variation indicated by distance 4613, equal to the sum of distances 4611 and 4612.

P-type pocket region 52 is located under lateral gate edge 561. P-type pocket region 52 is preferably formed by a high angled implant for the purpose of preventing punch through near the channel. Such high angle implant (and region 52) is often referred to as a HALO implant pocket or as a HALO pocket. Zero-degree (vertical) N-type implant 53 is provided extending from N+ source region 50 under edge 561 of gate 56 to insure that a high resistance region does not exist between source region 50 and channel 55 near P-type pocket region 52. Dielectric side-wall spacer 57 and silicide blocker 58 are provided covering lateral edges 561, 562 of gate 56 and extending over portion or distance 471 of surface 47 above N-type drift space 44 to drain 48. Portion 581 of spacer 58 between gate edge 562 and drain region 48 is referred to as a silicide blocker or silicide block region. Silicon nitride is a non-limiting example of a suitable material for side-wall spacer and silicide block region 57, 58. Other dielectrics can also be used. In an enhancement mode device, when a voltage is applied to gate 56 relative to P-region 42, channel 55 forms in P-region 42 underneath gate 56, thereby electrically connecting N+ source region 50 via N-type implant region 53 and P-type pocket region 52 to drain region 48 via N-type drift space 44.

Figure 3:
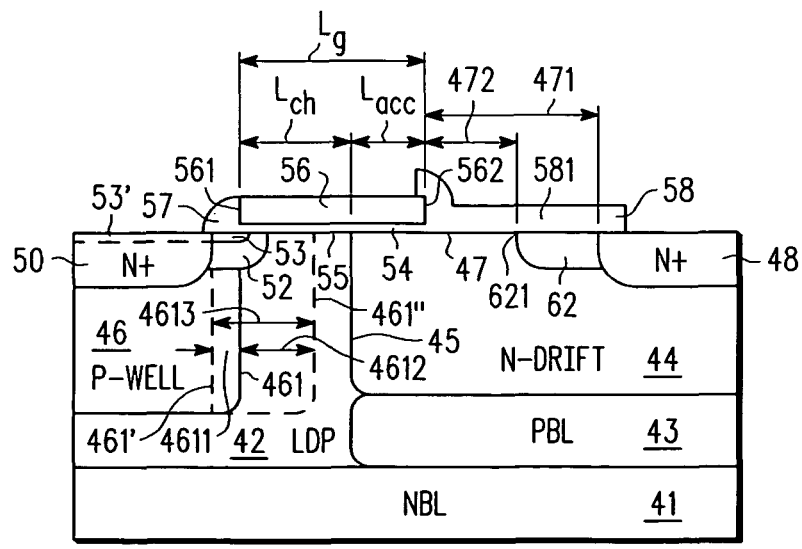
FIG. 3 is a simplified schematic cross-sectional view through an LDMOS device according to a further embodiment of the invention.

FIG. 3 is a simplified schematic cross-sectional view through LDMOS device 60 according to a further embodiment of the invention. Like reference numbers are used to identify like regions in FIGS. 2 and 3 and the description of such regions in connection with FIG. 2 is incorporated herein by reference. Device 60 of FIG. 3 and Device 40 of FIG. 2 differ in that device 60 includes further N-type doped region 62 adjacent drain 48. Region 62 is also referred to as a shallow N-well. Shallow N-well region 62 is preferably aligned so that its lateral edge 621 facing toward source 50, is located preferably approximately in the center of silicide block region 581, so that distance 472 is about half of distance 471. Stated more generally, it is desirable that lateral edge 621 be located so that distance 472 between lateral edge 562 of gate 56 and edge 621 is in the range of about 30% to 70% of distance 471 and preferably about 50% of such distance. The purpose of region 62 is to provide more gradual doping change in the vicinity of drain 48 so that the drain voltage drop is spread over a larger distance and the local E-field is correspondingly reduced. This limits or avoids substantial HCI even for voltages of 7.5 volts and greater.

It is important in connection with the invention that P-region 42 be very lightly doped, that is, in the range of about ~1E14 to ~5E15 cm$^{-3}$, preferably about less than or equal ~1E15 cm$^{-3}$. Very lightly doped P-region 42 provides improved HCI suppression, when compared with a typical P-substrate of prior art LDMOS device 20 of FIG. 1. P-well 46 is desirably more heavily doped, that is, in the range of about 5E16 cm$^{-3}$ to 1E19 cm$^{-3}$. P-type pocket region 52 is desirably doped in the range of about ~1E18 cm$^{-3}$ to ~1E19 cm$^{-3}$. Boron is a suitable dopant for these P-type regions. N-type vertical implant-region 53 is desirably doped in the range of about ~9E18 cm$^{-3}$ to ~9E19 cm$^{-3}$. N-type drift space 44 is desirably doped in the range of about ~1E16 cm$^3$ to ~1E18 cm$^{-3}$. N+ Source region 50 and N+ drain region 48 are desirably highly doped, as for example, to about ~1E20 cm$^{-3}$ or higher or stated another way, so as to have a sheet resistance of about 10 Ohms per square or less. Arsenic or phosphorous are suitable N-type dopants. In general, it is desirable that source region 50 be more heavily doped than P-type pocket region 52. Shallow N-well region 62 is desirably doped to a level intermediate between the doping of N-type drift space 44 and N+ drain region 48. Desirable doping levels for region 62 are in the range of about 5E17 to 1E19 cm$^{-3}$. Arsenic or phosphorous are suitable dopants for region 62. As noted earlier, P-type buried layer (PBL) 43 may be included in some implementations, but is not essential to the present invention. When included, PBL 43 desirably is doped in the range of about 1E17 to 5E17, but higher and lower doping can also be used.

Stated alternatively, the relative doping of the various regions in devices 40, 60 may be described in relative orders of magnitude as follows:

The doping of N-type drift space 44 should be about $10^1$-$10^3$ greater than the doping of P-region 42;

The doping of P-well 46 should be about $10^1$-$10^3$ greater than the doping of P-region 42;

The doping of HALO pocket 52 should be about $10^0$-$10^2$ greater than the doping of P-well 46, but less than the doping of N+ source region 50;

The doping of vertical N-type implant region 53 should be about $10^{0.5}$ to $10^1$ greater than the doping of HALO pocket 52, but less than the doping of source region 50; and The doping of N-type shallow well region 62 should be about $10^1$-$10^2$ greater than the doping of N-type drift space 44, but less than the doping of N+ drain region 48.

FIGS. 4-13 illustrate schematically, in cross-sectional view, manufacturing stages 80-89 in accordance with still further embodiments of the invention for fabricating the semiconductor device of FIGS. 2 and/or 3. For brevity, many conventional steps will only be mentioned briefly herein or will be omitted entirely without providing the well known process details. Structures 800-890 result from manufacturing stages 80-89 respectively. The discussion of the various regions that make up devices 40, 60 in connection with FIGS. 2-3 and relative doping types and levels of such regions is included herein by reference and FIGS. 4-13 should be considered in conjunction with FIGS. 2-3. As noted earlier, the manufacturing stages of FIGS. 4-13 are, for convenience of explanation and not intended to be limiting, described as for an N-channel device, but persons of skill in the art will understand that by substituting doping of opposite conductivity type for the various regions, P-channel and other types of devices may also be fabricated.

Figure 4:
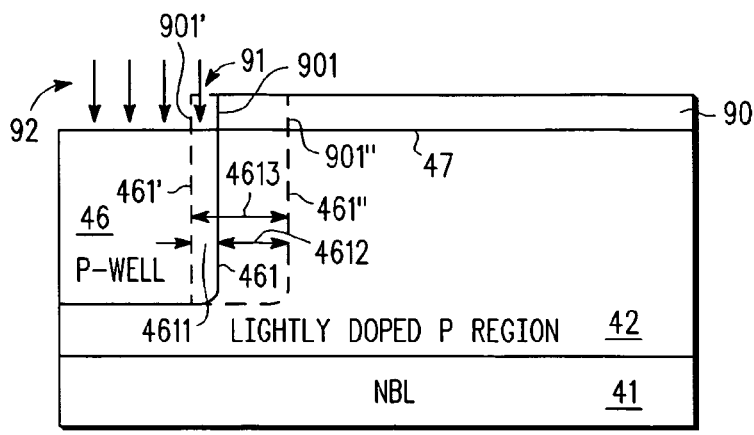
FIGS. 4-13 illustrate schematically, in cross-sectional view, method stages in accordance with still further embodiments of the invention for fabricating the LDMOS devices of FIGS. 2 and 3.

Referring now to manufacturing stage 80 of FIG. 4, supporting substrate 41 is provided. Substrate 41 may be a semiconductor of, for example and not intended to be limiting, silicon or other type IV or III-V or II-VI or organic semiconductor or combinations thereof, and may be in the form of a single crystal or polycrystalline or of a layer that has been formed on another substrate. Silicon-on-insulator (SOI) is a non-limiting example of such an alternative structure. For convenience of description, it is assumed herein the substrate 41 provides an N-type buried isolation layer (e.g., NBL 41 of FIGS. 2-3) underlying P-region 42, but this is not essential since other types of isolation may also be used. Lightly doped P-region (LDP) 42 having upper surface 47 is formed on substrate 41. Region 42 may be an inherent part of substrate 41 or may, for example, be an epitaxial layer. Either arrangement is useful. Mask 90 of, for example and not intended to be limiting, photo-resist or oxide or other dopant resistant material is provided on surface 47. Mask 90 has opening 91 through which, for example, P-type ion implantation 92 or other dopant is provided to form P-well 46 having lateral edge 461 extending to surface 47. By selecting different locations (e.g., 901, 901', 901") of lateral edge 901 of mask 90 relative to the location of the subsequent mask used to define gate 56 (e.g., see FIG. 7), lateral edges 461, 461', 461" of P-well 46 are obtained. For convenience of explanation and not intended to be limiting, it is assumed hereafter that location 901 was selected. P-well 46 is desirably doped to an approximate concentration in a range of about 5E16 cm$^{-3}$ to 1E19 cm$^{-3}$, preferably about 1E17 cm$^{-3}$ to 5E18 cm$^{-3}$, wherein the higher the doping concentration the better the ability for P-well 46 to prevent bulk punch-through. This results in structure 800.

Figure 5:
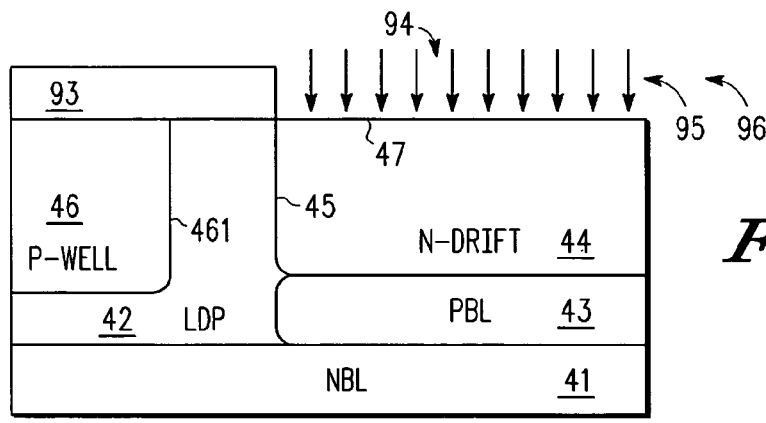

In manufacturing stage 81 of FIG. 5, mask 90 on surface 47 of structure 800 is removed and surface 47 is covered with mask 93 of, for example and not intended to be limiting, photo-resist or oxide or other dopant resistant material. Mask 93 has opening 94 through which, for example, high energy P-type ion implantation 95 or other dopant is provided in some implementations to form P-type buried layer (PBL) 43 and/or lower energy N-type ion implantation 96 or other dopant is provided to form N-type drift space or region 44. Both implants are desirably made through opening 94 of mask 90. The relative implant energy is adjusted so that PBL 43 lies beneath N-type drift space or region 44. N-type drift space or region 44 creates with P-type region 42, PN junction 45 extending to surface 47. PBL 43 is conveniently doped in the range of about 1E17 to 5E17 cm$^{-3}$. Drift space or region 44 is conveniently doped in the range of about 1E16 to 1E18 cm$^{-3}$. Structure 810 results. Manufacturing stages 80 and 81 and implants 95, 96 may be performed in either order.

Figure 6:
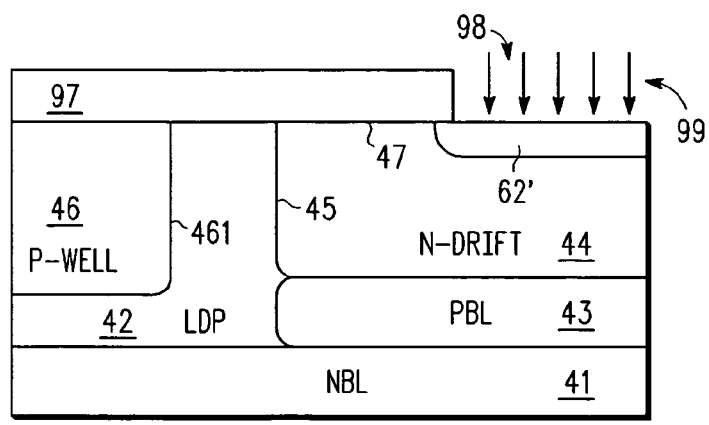

Manufacturing stage 82 of FIG. 6 is used in forming device 60 of FIG. 3 but is omitted in forming device 40 of FIG. 2. In manufacturing stage 82, structure 810 with mask 93 removed, has mask 97 formed on surface 47. Mask 97 has opening 98 through which N-type ion implantation 99 or other doping means is provided to form shallow N-type layer or region 62'. Desirable doping levels for region 62' are in the range of about 5E17 cm$^{-3}$ to 1E19 cm$^{-3}$. Layer or region 62' is the precursor to shallow N-well 62 of FIG. 3. Structure 820 results. For convenience of explanation and not intended to be limiting, it is assumed hereafter that region 62', 62 is included.

Figure 7:
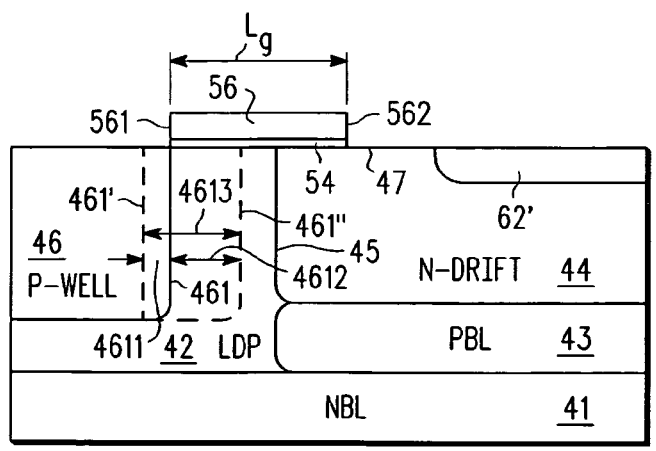

In manufacturing stage 83 of FIG. 7, mask 97 is removed (if used) and gate oxide 54 and gate 56 are formed and patterning using a conventional hard and/or soft mask (not shown) and associated etching steps. Gate insulator 54 may be a thermally grown silicon dioxide formed by heating substrate 41 in an oxidizing ambient, or may be a deposited insulator such as a silicon oxide, silicon nitride, silicon oxy-nitride, a high dielectric constant insulator such as HfSiO, or the like. Deposited insulators can be formed by chemical vapor deposition (CVD), low pressure chemical vapor deposition (LPCVD), plasma enhanced chemical vapor deposition (PECVD), atomic layer deposition (ALD) or by other means. Gate insulator 54 is typically 1-50 nanometers (nm) in thickness depending on gate and drain operating voltages, with about 8-10 nanometers being preferred. As previously explained, lateral edge 561 of gate 56 can be located anywhere within distance 4613 relative to P-well 46 depending upon where P-well edge 461', 461, 461" has been placed, that is, in "substantial alignment" with edge 461 of P-well 46. In a preferred embodiment, gate edge 561 is located as close to being aligned with edge 461 of P-well 46 as is permitted by the lithographic alignment system being used, but at least within the boundaries of distances 4611 and 4612. For convenience of description and not intended to be limiting, in the figures that follow, gate edge 561 and P-well edge 461 are shown as being aligned. A photoresist or hard mask layer (not shown) is conveniently used and lithographically patterned to define gate 56 and gate insulator 54. Preferably gate 56 has length Lg in the source-drain direction equal to or greater than the minimum line width allowable by the design rules used to lay out the integrated circuit of which LDMOS device 40, 60 may be a part. The polycrystalline silicon typically used for gate 56 and the silicon oxide typically used for gate insulator 54 can be etched in the desired pattern by, for example, plasma etching in a Cl or $HBr/O_2$ chemistry. Structure 830 results.

Figure 8:
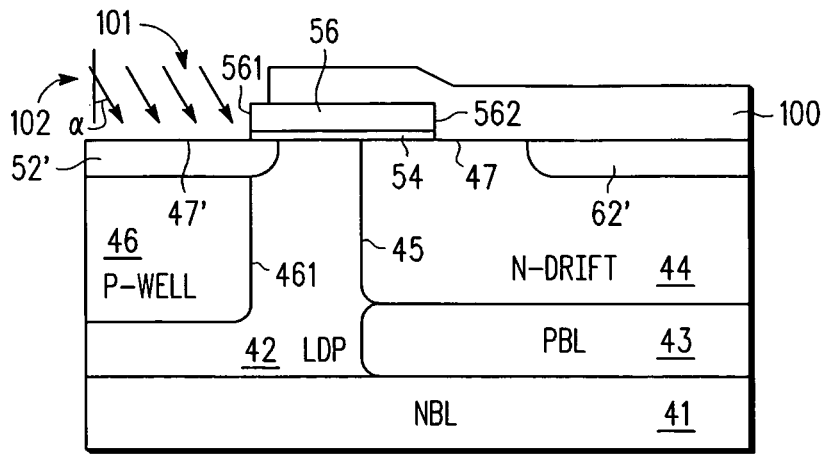
Figure 9:
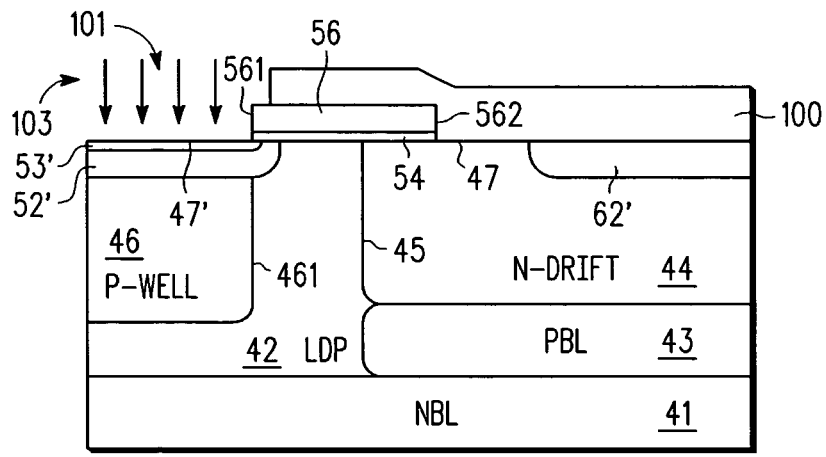

In manufacturing stage 84 of FIG. 8, structure 830 is provided with mask 100 having opening 101 through which P-type HALO implant 102 is made at angle α to form P-type layer or region 52'. Region 52' is the precursor to region 52 of FIGS. 2 and 3, also referred to as HALO region 52 or HALO pocket 52. Following formation of mask 100, structure 830 is preferably subjected to an angled unidirectional ion implantation process. The angled unidirectional ion implantation is preferably performed using ions of the same doping material as for P-region 42, such as germanium (Ge), arsenic (As), phosphorous (P), boron (B), and the like depending upon the conductivity type of the device being formed, except that HALO implant region 52' is more heavily doped than region 42. In this exemplary embodiment for forming an N-channel device, HALO implant region 52' is doped with boron ions to a concentration level in a range of about 1E18 to 1E19 $cm^{-3}$. The ion implantation process conveniently uses boron ions that are directed at surface 47' (i.e., the surface closest to a source region) of structure 830 (with mask 100) at an acute angle α from an axis that is perpendicular to surface 47'. Angle α is usefully at least as great as about 7 degrees and less than about 90 degrees. In a preferred embodiment, the tilted angle implant is performed at between about 45-60 degrees to form HALO implant region 52'. Boron ions are preferably implanted at an energy of about 30 KeV and at an implant doping concentration of about $5 \times 10^{18}$ $cm^{-3}$. It will be appreciated that, because such ion implantation is unidirectional and is oriented at an angle, ions will be implanted into surface 47' of structure 840 that is exposed to or facing the source of the ions. The angled implant is directed to the source side of gate 56 and forms HALO implant region 52', where gate 56 serves as a partial mask. Gate 56 provides self-alignment of HALO implant region 52'. Structure 840 results. Subsequent to the formation of halo implant region 52', in further manufacturing stage 85 of FIG. 9, N-type source extension region 53 is desirably formed, e.g. of phosphorus ions that are implanted at angle α=0 degree with an energy of about 30 KeV and at an implant doping concentration level in a range of about 9E18 $cm^{-3}$ to about 9E19 $cm^{-3}$. N-type region 53 serves to connect N+ source region 50 to channel 55 (see FIGS. 2-3). Structure 850 results.

Figure 10:
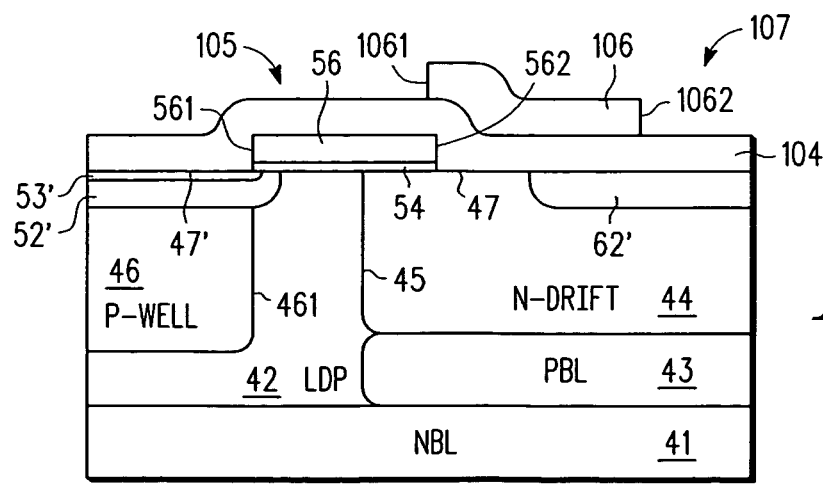

In manufacturing stage 86 of FIG. 10, mask 100 is removed from structure 850 and blanket dielectric layer 104 of, for example and not intended to be limiting, silicon nitride is provided on surface 47 and over gate 56. After patterning and etching, layer 104 yields side-wall spacer 57 and silicide blocker 58 (see FIGS. 2-3 and 11). Mask 106 is formed over dielectric layer 104 and patterned to provide openings 105, 107. Photoresist is a non-limiting example of a material suitable for forming mask 106. Edge 1061 of mask 106 should be located slightly to the left of lateral edge 562 of gate 56 so that, after etching of layer 104 laterally outside of mask 106, lateral gate edge 562 remains covered by some of the material of layer 104. Edge 1062 of mask 106, will substantially define the location of drain region 48 (see FIGS. 2-3) and, is therefore placed within N-type region 62' and/or N-type drift space 44 so as to provide the proper separation of drain region 48 from gate 56. Structure 860 results.

Figure 11:
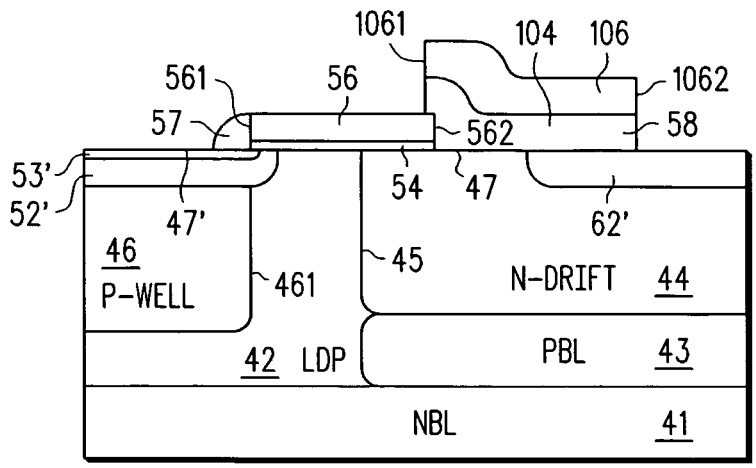
Figure 12:
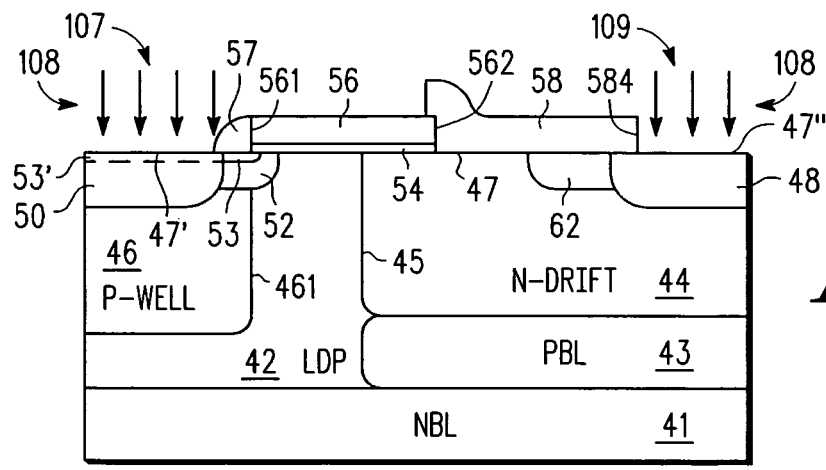
Figure 13:
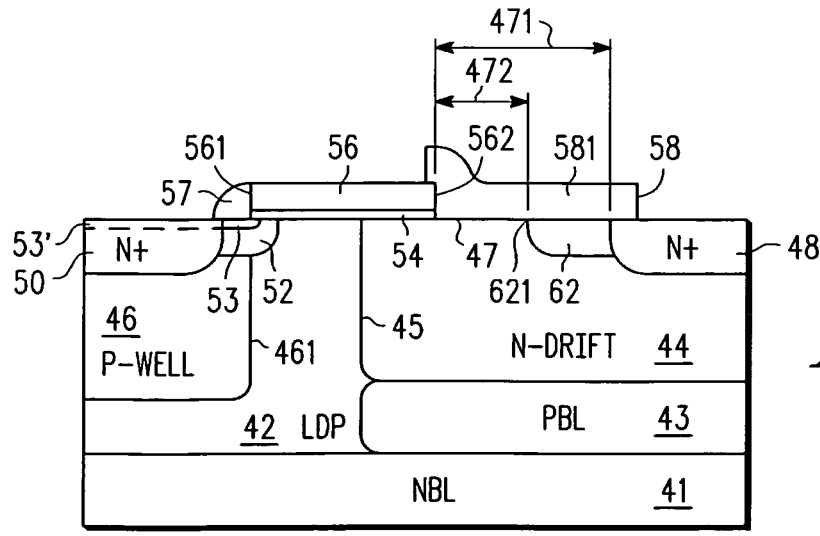

In manufacturing stage 87 of FIG. 11, dielectric layer 104 of structure 860 is anisotropically etched so as to leave behind sidewall spacer 57 and silicide blocker 58. Structure 870 results. In manufacturing stage 88 of FIG. 12, mask 106 is optionally removed and N-type ions or other dopant 108 introduced into structure 870 through surface 47' of source-side opening 107 and through surface 47" of drain-side opening 109, thereby forming N+ source region 50 and N+ drain region 48, respectively. Ion implantation is preferred. Structure 880 results. Source 50 and drain 48 may be shallower, deeper or the same depth as than N-type region 53', P-type HALO region 52' and/or shallow N-well region 62' depending upon the particular device being designed and compatibility with other devices on the same chip. Either arrangement is useful. The source-gate spacing is determined by sidewall spacer 57 less any lateral diffusion associated with the doping step, e.g., implant and anneal. Gate-drain spacing 471 (see FIGS. 2-3) is determined by the location of edge 584 of silicide blocker 58, less any lateral diffusion associated with the doping step, e.g., implant and anneal. Since lateral diffusion associated with the implant step is generally small and well known, gate-drain separation 471 is well controlled and the desirable condition described earlier that distance 472 is a pre-determined percentage of distance 471, can be readily achieved by appropriately locating lateral edge 584 of silicide blocker 58. Structure 890 of FIG. 13 results, conforming in this example, to device 60 of FIG. 3. By omitting region 62, 62', device 40 of FIG. 2 is obtained.

It will be understood by those of skill in the art based on the description herein that in order to form P-channel devices in alternate embodiments, region 42 is N-type, well 46 is made N-type drift space 44 is made P-type, and so forth for the other regions described above. Accordingly, the more general terms "first conductivity type" and "second, opposite conductivity type" can be used to describe these regions, wherein the terminology "first conductivity type" and second, opposite conductivity type" are intended to refer to either P or N conductivity types. For example, "first conductivity type" can be either N or P type, and "second, opposite conductivity type" then refers to the opposite P or N conductivity type respectively.

Figure 14:
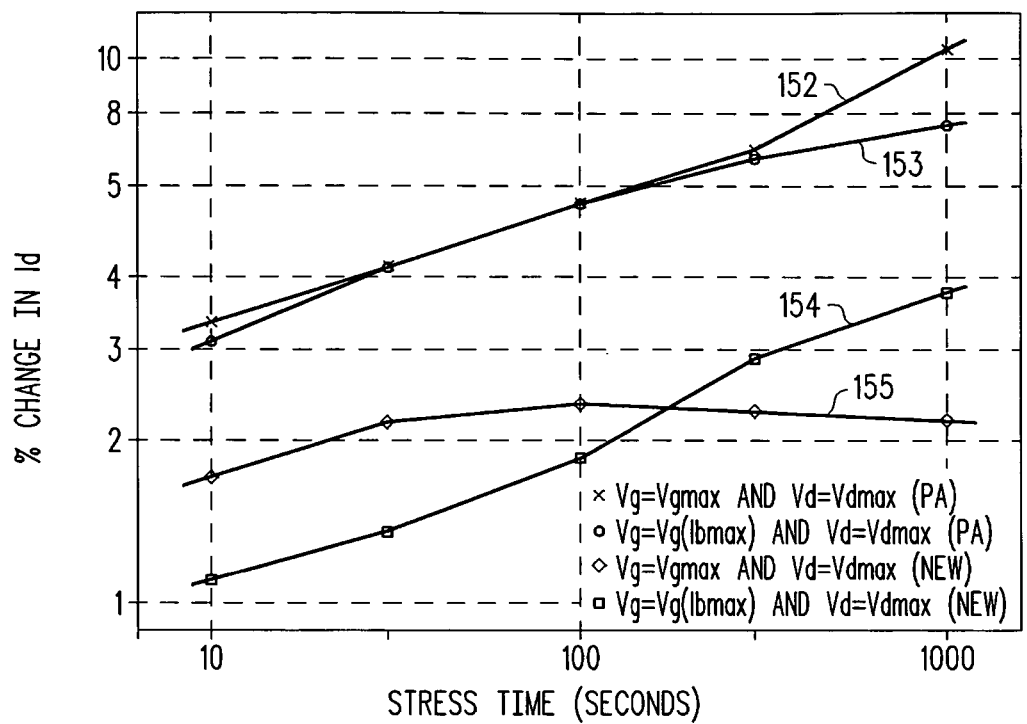
FIG. 14 shows a plot of percent change in drain current Id as a function of stress time in seconds for an N-channel LDMOS device of the prior art (labeled "PA") and for an otherwise substantially similar device but according to an embodiment of the invention (labeled "new")

FIG. 14 shows plot 150 of the percent change in linear drain current Id as a function of stress time in seconds for an N-channel LDMOS according to the prior art (e.g., device 20) and for an otherwise substantially similar LDMOS device according to an embodiment of the invention (e.g., device 60). The two devices had substantially similar active areas and were tested under substantially similar circumstances. Traces 152-153 were obtained from the prior-art device (labeled "PA" in the legend of FIG. 14), and traces 154-155 were obtained from an invented device of the type illustrated in FIG. 3 (labeled "new" in the legend of FIG. 14). Stress conditions applied to the devices are of two types: In a first test, maximum gate-source voltage (Vgsmax) and drain-source voltage (Vdsmax) are applied to the device and the change in source-drain current (Id) monitored. These traces are labeled "Vgsmax & Vdsmax" in the legend. In a second test, gate voltage (Vg(Ibmax)) is applied such that maximum body current Ib is obtained in the device while maximum drain voltage (Vdmax) is applied, and source-drain current Id monitored. These second curves are labeled "Vgs(Ibmax) & Vdsmax" in the legend. By comparing trace 152 to trace 154 and trace 153 to trace 155, it will be noted that for equal stress time, e.g., 1000 minutes, and substantially comparable bias conductions, that the percent change in linear drain current Id as a result of the stress was nearly 70% less for the invented device compared to the prior art device. This is a significant improvement.

Figure 15:
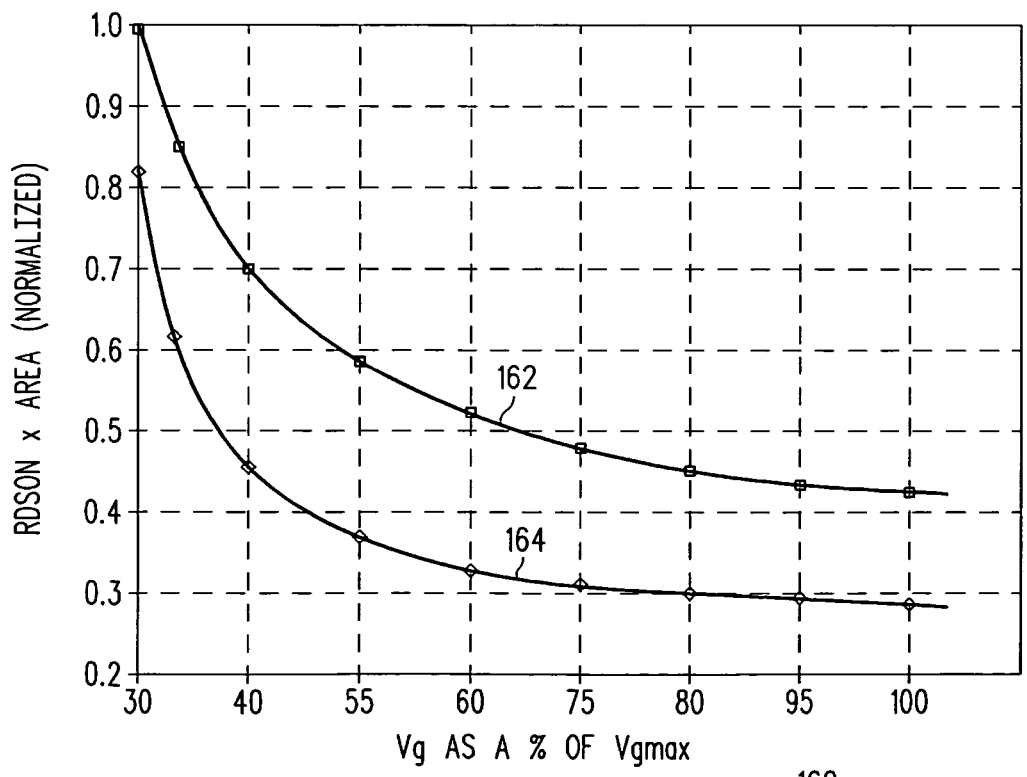
FIG. 15 shows a plot of normalized Rdson×Area, as a function of gate voltage expressed as a percentage of the maximum gate voltage Vgmax, for an N-type LDMOS device according to the prior art and for an otherwise substantially similar device but according to an embodiment of the invention.

FIG. 15 shows plot 160 of normalized on-state drain resistance Rdson×area, as a function of gate voltage as a percentage of Vgmax, for an N-type LDMOS device according to the prior art (e.g., device 20) and for an otherwise substantially similar device but according to an embodiment of the invention (e.g., device 60). The two devices had substantially similar active areas and were tested under substantially similar circumstances. The source-drain ON-state resistance (Rdson)×area product was normalized to the value exhibited by the prior art device at Vg=30% of Vgmax. Trace 162 corresponds to the prior art device illustrated in FIG. 1 and trace 164 corresponds to an embodiment of the invented device illustrated in FIG. 3. It will be noted that the invented device has approximately 15-25% lower resistance Rdson for the same device area. This is a significant improvement. The other operating properties of the invented device (e.g., gain, frequency response, dissipation, etc.) were at least as good as or better than those of the prior art device. Thus, not only has the device stability and reliability been improved (e.g., as shown in FIG. 14) by, for example reducing the hot carrier injection (HCI) occurring in the device, but the electrical properties, as for example, the on-state source-drain resistance (Rdson) has also been significantly improved, without significant adverse consequences on other device properties. This combination of improvements is especially significant. Comparable improvements were obtained with both N and P channel devices. In addition to the improvement in properties illustrated above, it was found that, device dimensions could also be significantly shrunk without significant adverse consequences, thereby allowing a larger number of devices to be packed into the same chip area. This provides significant manufacturing cost reductions.

According to a first embodiment, there is provided a method of fabricating a semiconductor device, comprising the steps of, providing a semiconductor having a lightly doped substrate region of a first conductivity type extending to a surface of the semiconductor, impurity doping a first region of the first conductivity type in a first portion of said substrate region to form a first doped well having a first lateral edge extending to said surface, impurity doping a second region of a second, opposite, conductivity type within a second portion of said substrate region spaced apart from said first portion, thereby forming a second doped well and a first PN junction with said substrate region, wherein a portion of said PN junction extends to said surface, forming a gate electrode overlying said surface and having a gate dielectric formed therebetween, wherein a first lateral edge of said gate electrode is substantially aligned with said first edge and a second opposite edge of said gate electrode extends beyond said portion of said PN junction, implanting an impurity ion selectively into said first doped well at an angle greater than zero from an axis perpendicular to said surface, said impurity ion forming a HALO implant region in substantial self alignment with said gate electrode, impurity doping a source region of said second conductivity type at least partly in said first doped well, and impurity doping a drain region of said second conductivity type in a part of the second doped well spaced apart from said gate electrode. According to a further embodiment, the method comprises, impurity doping a further region in said second doped well with a dopant of said second type spaced apart from said gate electrode and having an impurity concentration greater than an impurity concentration of said second doped well and less than the drain region and located so as to be in ohmic contact with said drain region. According to a still further embodiment, said lightly doped substrate region has an impurity concentration in the range of about 1E14 to 5E15 cm$^{-3}$. According to a yet further embodiment, the first doped well has an impurity concentration in the range of about $10^1$ to $10^3$ times that of the doped substrate region. According to a still yet further embodiment, the HALO implant region has an impurity concentration of about $10^0$ to $10^2$ times an impurity concentration of the first doped well. According to a yet still further embodiment, wherein the gate electrode has a first length in the source-drain direction and said first lateral edge of the gate electrode is aligned with said first edge at or within about 15% of said first length toward the source or about 25% of said first length toward the drain. According to another embodiment, wherein said first lateral edge of the gate electrode is aligned with said first edge at or within about 10% of said first length toward either the source or the drain. According to a still further embodiment, the step of implanting an impurity ion to form a HALO implant region comprises implanting at an angle relative to a normal to said surface in the range of 7 to 90 degrees. According to a yet further embodiment, the further region is formed so as to have a left edge located between 30% and 70% of a distance between a right edge of said gate electrode and said drain region.

According to a second embodiment, there is provided a semiconductor device, comprising, a semiconductor substrate having a lightly doped region of a first conductivity type and first dopant concentration extending to a surface, a first well of said first conductivity type and second dopant concentration larger than said first dopant concentration, in said lightly doped region and with a first edge extending to said surface, a second well of a second, opposite, conductivity type and third dopant concentration larger than said first dopant concentration, in and forming a PN junction with said lightly doped region and spaced apart from said first well, wherein said PN junction extends to said surface, a gate electrode overlying and insulated from said surface, having a left edge substantially aligned with said first edge and a rightward extension over a portion of said lightly doped region at least to said second well, a HALO implant region of said first conductivity type and a fourth dopant concentration extending beyond said first edge toward said second well, a source region of said second conductivity type and fifth dopant concentration at least partly in said first well, communicating with said HALO implant region, and a drain region of said second conductivity type and sixth dopant concentration in said second well and spaced apart from said gate electrode. According to a further embodiment, the device further comprises, a further region of said second conductivity type and seventh dopant concentration in said second doped well, spaced apart from said gate electrode, in ohmic contact with said drain region, wherein said seventh dopant concentration is greater than said third dopant concentration and less than said sixth dopant concentration. According to a still further embodiment, the further region has a leftward edge located at 30% and 70% of a distance between a right edge of said gate electrode and said drain region. According to a yet further embodiment, the further region has a leftward edge located at about 50% of a distance between a right edge of said gate electrode and said drain region. According to a still yet further embodiment, the first dopant concentration is in the range of about 1E14 to 5E15 cm$^{-3}$. According to a yet still further embodiment, the first dopant concentration is about 1E15 cm$^{-3}$. According to another embodiment, said gate electrode has a length Lg in the source-drain direction and wherein its left edge is aligned with said first edge at or within a distance of about 15% of Lg toward the source or about 25% of Lg toward the drain. According to a yet another embodiment, the second dopant concentration is in the range of about $10^1$ to $10^3$ times the first dopant concentration, and the fourth dopant concentration is in the range of about $10^0$ to $10^2$ times the second dopant concentration.

According to a third embodiment, there is provided a method for forming an LDMOS device, comprising, providing a semiconductor substrate having a first region of first conductivity type and first dopant concentration in the range of about 1E14 cm$^{-3}$ to 5E15 cm$^{-3}$, extending to a surface, forming first and second wells in the first region, spaced apart by a portion of the first region and having, respectively, first and second conductivity types and second and third dopant concentrations and first and second lateral edges, wherein the first and second lateral edges extend to the surface and the second conductivity type is opposite the first conductivity type, forming a gate electrode insulated from the surface, overlying the portion of the first region and having a left lateral edge substantially aligned with the first edge and a right lateral edge located at or beyond the second edge, using the gate electrode as at least a partial mask, implanting impurities at an angle to form a HALO pocket beneath the surface overlapping the first edge, and implanting source and drain regions of the second conductivity type, the source region at least partly in the first well and the drain region located in the second well a first distance from the right lateral edge of the gate electrode. According to a further embodiment, the method comprises, implanting a shallow third well of the second conductivity type in the second well and having a left edge located at a second distance from the right lateral edge of the gate electrode, wherein the second distance is in the range of 30% and 70% of the first distance. According to a still further embodiment, the second dopant concentration is in the range of about 5E16 to 1E19 cm$^{-3}$. According to a yet further embodiment, the gate electrode has a length Lg in the source-drain direction and wherein the left lateral edge of the gate electrode is aligned to the first edge by a distance less than or equal to about 10% of Lg.

While at least one exemplary embodiment and method of fabrication has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method of fabricating a semiconductor device, comprising the steps of:
   providing a semiconductor having a lightly doped substrate region of a first conductivity type and a first impurity concentration extending to a surface of the semiconductor;
   impurity doping a first region of the first conductivity type through an opening in a first mask that exposes a first portion of said substrate region to form a first doped well having a first lateral edge extending to said surface, wherein the first doped well has a second impurity concentration that is greater than the first impurity concentration of the lightly doped substrate region;
   impurity doping a second region of a second, opposite, conductivity type through an opening in a second mask that exposes a second portion of said substrate region that is spaced apart from said first portion, thereby forming a second doped well and a first PN junction between the second doped well and said substrate region, wherein a portion of said PN junction extends to said surface;
   forming a gate electrode overlying said surface and having a gate dielectric formed therebetween, wherein a first lateral edge of said gate electrode is substantially aligned with said first edge and a second opposite edge of said gate electrode extends beyond said portion of said PN junction;
   implanting an impurity ion selectively into said first doped well at an angle greater than zero from an axis perpendicular to said surface, said impurity ion forming a HALO implant region in substantial self alignment with said gate electrode;
   impurity doping a source region of said second conductivity type at least partly in said first doped well; and
   impurity doping a drain region of said second conductivity type in a part of the second doped well spaced apart from said gate electrode.

2. The method of claim 1, further comprising:
   impurity doping a further region in said second doped well with a dopant of said second type spaced apart from said gate electrode and having an impurity concentration greater than an impurity concentration of said second doped well and less than the drain region and located so as to be in ohmic contact with said drain region.

3. The method of claim 1, wherein said lightly doped substrate region has an impurity concentration in the range of about 1E14 to ~5E15 cm$^{-3}$.

4. The method of claim 3, wherein the first doped well has an impurity concentration in the range of about $10^1$ to $10^3$ times that of the lightly doped substrate region.

5. The method of claim 4, wherein said HALO implant region has an impurity concentration of about $10^0$ to $10^2$ times an impurity concentration of the first doped well.

6. The method of claim 1, wherein the gate electrode has a first length in the source-drain direction and said first lateral edge of said gate electrode is aligned with said first edge at or within about 15% of said first length toward the source or about 25% of said first length toward the drain.

7. The method of claim 6, wherein said first lateral edge of the gate electrode is aligned with said first edge at or within about 10% of said first length toward either the source or the drain.

8. The method of claim 1, wherein the step of implanting an impurity ion to form a HALO implant region comprises implanting at an angle relative to a normal to said surface in the range of 7 to 90 degrees.

9. The method of claim 2, wherein said further region is formed so as to have a left edge located between 30% and 70% of a distance between a right edge of said gate electrode and said drain region.

10. A semiconductor device, comprising:
a semiconductor substrate having a lightly doped region of a first conductivity type and first dopant concentration extending to a surface;
a first well of said first conductivity type and second dopant concentration larger than said first dopant concentration, in said lightly doped region and with a first edge extending to said surface;
a second well of a second, opposite, conductivity type and third dopant concentration larger than said first dopant concentration formed in said lightly doped region, wherein the second well is spaced apart from said first well by a portion the lightly doped region between the first and second wells that extends to the surface, and a PN junction that extends to said surface is formed between the second well and the portion of said lightly doped region that extends to the surface;
a gate electrode overlying and insulated from said surface, having a left edge substantially aligned with said first edge and a rightward extension over a portion of said lightly doped region at least to said second well;
a HALO implant region of said first conductivity type and a fourth dopant concentration extending beyond said left edge toward said second well;
a source region of said second conductivity type and fifth dopant concentration at least partly in said first well communicating with said HALO implant region; and
a drain region of said second conductivity type and sixth dopant concentration in said second well and spaced apart from said gate electrode.

11. The device of claim 10, further comprising:
a further region of said second conductivity type and seventh dopant concentration in said second doped well, spaced apart from said gate electrode and in ohmic contact with said drain region, wherein said seventh dopant concentration is greater than said third dopant concentration and less than said sixth dopant concentration.

12. The device of claim 11, wherein said further region has a leftward edge located at 30% and 70% of a distance between a right edge of said gate electrode and said drain region.

13. The device of claim 11, wherein said further region has a leftward edge located at about 50% of a distance between a right edge of said gate electrode and said drain region.

14. The device of claim 11, wherein the first dopant concentration is in the range of about 1E14 to ~5E15 cm$^{-3}$.

15. The device of claim 13, wherein said gate electrode has a length Lg in the source-drain direction and wherein its left edge is aligned with said first edge at or within a distance of about 15% of Lg toward the source or about 25% of Lg toward the drain.

16. The device of claim 14, wherein the second dopant concentration is in the range of about $10^1$ to $10^3$ times the first dopant concentration, and the fourth dopant concentration is in the range of about $10^0$ to $10^2$ times the second dopant concentration.

17. A method for forming an LDMOS device, comprising:
providing a semiconductor substrate having a first region of a first conductivity type and first dopant concentration in the range of about 1E14 cm$^{-3}$ to 5E15 cm$^{-3}$, extending to a surface;
forming first and second wells in the first region, spaced apart by a portion of the first region that extends to the surface and having, respectively, the first conductivity type and a second conductivity type and second and third dopant concentrations, wherein the first well has a first and second lateral edges edge that extends to the surface, the second well has a second lateral edge that extends to the surface, thus forming a PN junction that extends to the surface between the second well and the portion of the first region that separates the first and second wells, the second conductivity type is opposite the first conductivity type, and the second dopant concentration is greater than the first dopant concentration;
forming a gate electrode insulated from the surface, overlying the portion of the first region that separates the first and second wells and having a left lateral edge substantially aligned with the first lateral edge and a right lateral edge located at or beyond the second lateral edge;
using the gate electrode as at least a partial mask, implanting impurities at an angle greater than zero from an axis perpendicular to the surface to form a HALO pocket beneath the surface overlapping the first edge; and
implanting source and drain regions of the second conductivity type, the source region at least partly in the first well and the drain region located in the second well a first distance from the right lateral edge of the gate electrode.

18. The method of claim 17, further comprising:
implanting a shallow third well of the second conductivity type in the second well and having a left edge located at a second distance from the right lateral edge of the gate electrode, wherein the second distance is in the range of 30% to 70% of the first distance.

19. The method of claim 17, wherein the second dopant concentration is in the range of about 5E16 to 1E19 cm$^{-3}$.

20. The method of claim 19, wherein the gate electrode has a length Lg in the source-drain direction and wherein the left lateral edge of the gate electrode is aligned to the first edge by a distance less than or equal to about 10% of Lg.

* * * * *